(12) United States Patent
Ogihara (10) Patent No.: US 6,881,978 B2
(45) Date of Patent: Apr. 19, 2005

(54) SEMICONDUCTOR EPITAXIAL STRUCTURE AND SEMICONDUCTOR LIGHT-EMITTING DEVICE

(75) Inventor: Mitsuhiko Ogihara, Hachioji (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 10/725,078

(22) Filed: Dec. 2, 2003

(65) Prior Publication Data

US 2004/0113225 A1 Jun. 17, 2004

(30) Foreign Application Priority Data

Dec. 3, 2002 (JP) ........................................ 2002-350808

(51) Int. Cl.⁷ .............................................. H01L 27/15
(52) U.S. Cl. .............................. 257/79; 257/87; 257/88
(58) Field of Search .............................. 257/79, 86–88, 257/13

(56) References Cited

U.S. PATENT DOCUMENTS

| | | | | |
|---|---|---|---|---|
| 4,510,515 A | * | 4/1985 | Kajita et al. .................. | 257/87 |
| 5,204,869 A | * | 4/1993 | Valster et al. ................. | 372/45 |
| 6,180,961 B1 | * | 1/2001 | Ogihara et al. ............... | 257/94 |
| 6,337,536 B1 | * | 1/2002 | Matsubara et al. ......... | 313/498 |
| 6,716,659 B1 | * | 4/2004 | Wipiejewski ................ | 438/44 |

FOREIGN PATENT DOCUMENTS

JP 11-340501 12/1999

OTHER PUBLICATIONS

Y. Okuno, *Hakko Diodo* (Light–Emitting Diodes), published by Sangyo Tosho, 1993, pp. 29–31.

* cited by examiner

*Primary Examiner*—T. N. Quach
(74) *Attorney, Agent, or Firm*—Rabin & Berdo, P.C.

(57) ABSTRACT

A semiconductor epitaxial structure includes a first semiconductor epitaxial layer and a second semiconductor epitaxial layer having a wider energy band gap than the first semiconductor epitaxial layer. The first semiconductor epitaxial layer includes a first sublayer of one conductive type and a second sublayer of the opposite conductive type. A pn junction is formed between the two sublayers. The semiconductor epitaxial structure may also include a third semiconductor epitaxial layer having a wider energy band gap than the first semiconductor epitaxial layer, the first semiconductor epitaxial layer being sandwiched between the second and third semiconductor epitaxial layers. This semiconductor epitaxial structure can be used in a semiconductor light-emitting device to obtain high emissive efficiency and an operating characteristic that remains linear into the high current injection region.

15 Claims, 8 Drawing Sheets

SEMICONDUCTOR EPITAXIAL STRUCTURE AND SEMICONDUCTOR LIGHT-EMITTING DEVICE

BACKGROUND OF THE INVENTION

1. Field of the Invention

The present invention relates to a semiconductor epitaxial structure in which a plurality of semiconductor epitaxial films are grown on a substrate, and a semiconductor light-emitting device incorporating this epitaxial structure.

2. Description of the Related Art

Light-emitting devices comprising aluminum gallium arsenide (AlGaAs) compound semiconductor epitaxial layers are well known. A semiconductor light-emitting device having a p-type $Al_xGa_{1-x}As$ active layer (x=0.35) sandwiched between a p-type $Al_xGa_{1-x}As$ cladding layer (x=0.65) and an n-type $Al_xGa_{1-x}As$ cladding layer (x=0.65) is described by Y. Okuno in Hakko Diodo (Light-Emitting Diodes), published by Sangyo Tosho (1993). A semiconductor light-emitting device having a non-doped $Al_xGa_{1-x}As$ active layer (x=0.2) sandwiched between a p-type $Al_xGa_{1-x}As$ cladding layer (x=0.4) and an n-type $Al_xGa_{1-x}As$ cladding layer (x=0.4) is disclosed in FIG. 4 of Japanese Unexamined Patent Application Publication No. 11-340501 (1999).

In the first of these conventional devices, a pn junction is formed at the interface between the p-type active layer and the n-type cladding layer. When a forward voltage is applied, electrons in the conduction band are injected as minority carriers from the n-type cladding layer into the p-type active layer. If the energy barrier formed at the interface between the p-type active layer and the p-type cladding layer is sufficiently high, the injected electrons cannot diffuse into the p-type cladding layer and are confined to the p-type active layer. In the valence band, if the energy barrier between the p-type active layer and the n-type cladding layer is sufficiently high, holes are unable to move into the n-type cladding layer. The holes, however, are majority carriers in the p-type region comprising the p-type cladding layer and the p-type active layer, where they can be regarded as being distributed evenly. A consequent problem is that, although the electron-hole recombination rate is enhanced by a heightened concentration of injected electrons in the active layer, it is not enhanced by a heightened concentration of injected holes.

In the second conventional device mentioned above, if the flow of forward current is increased to increase the optical output, the number and density of carriers injected into the active layer increases, but if the density of injected carriers in the active layer becomes extremely high, carriers overflow from the active layer into the cladding layers, and the optical output does not continue to increase in proportion to the current. Furthermore, if the majority carrier density (impurity doping carrier concentration) is very low in the active layer, the injected minority carrier density is much higher than the majority carrier density in the active layer. An active layer not doped with an impurity can provide a very low majority carrier density. In such cases, the emitted light power or power density (emitted light power per unit area) is mainly proportional to the square of the applied current density (applied current per unit area). The operating characteristic (optical output v. current) therefore has poor linearity in the high current injection region.

If the thickness of the active layer in the second conventional device above is increased to reduce carrier overflow, or if the energy barrier at the active-cladding interfaces is increased, the p-to-n resistance of the hetero-epitaxial structure formed by the p-type cladding layer, non-doped active layer, and n-type cladding layer increases, increasing the power consumption of the device. This is problematic, because a semiconductor light-emitting device is frequently required to have a specified resistance and operate without consuming more than a specified amount of power.

SUMMARY OF THE INVENTION

An object of the present invention is to provide a semiconductor epitaxial structure that enables a semiconductor light-emitting device to combine high light-emitting efficiency with a highly linear operating characteristic in the high current injection region.

The invention provides a semiconductor epitaxial structure including a first semiconductor epitaxial layer and a second semiconductor epitaxial layer. The first semiconductor epitaxial layer, which has a narrower energy band gap than the second semiconductor epitaxial layer, includes a first semiconductor epitaxial sublayer of a first conductive type, a second semiconductor epitaxial sublayer of a second conductive type, and a pn junction interface between the first and second semiconductor epitaxial sublayers. The semiconductor epitaxial structure may also include a third semiconductor epitaxial layer having a wider energy band gap than the first semiconductor epitaxial layer, the first semiconductor epitaxial layer being sandwiched between the second and third semiconductor epitaxial layers.

The invention also provides a semiconductor light-emitting device employing the above semiconductor epitaxial structure as a light-emitting area, or employing an array of such semiconductor epitaxial structures as light-emitting areas.

The presence of sublayers of both p and n conductive types in the first semiconductor epitaxial layer enables injected minority carriers of both (p and n) types to be confined at high density in the first semiconductor epitaxial layer. When the semiconductor epitaxial structure is used for light emission, a high emissive efficiency is therefore obtained, and the operating characteristic remains linear into the high current injection region.

DETAILED DESCRIPTION OF THE INVENTION

Embodiments of the invention will now be described with reference to the attached drawings, in which like elements are indicated by like reference characters.

First Embodiment

Figure 1:
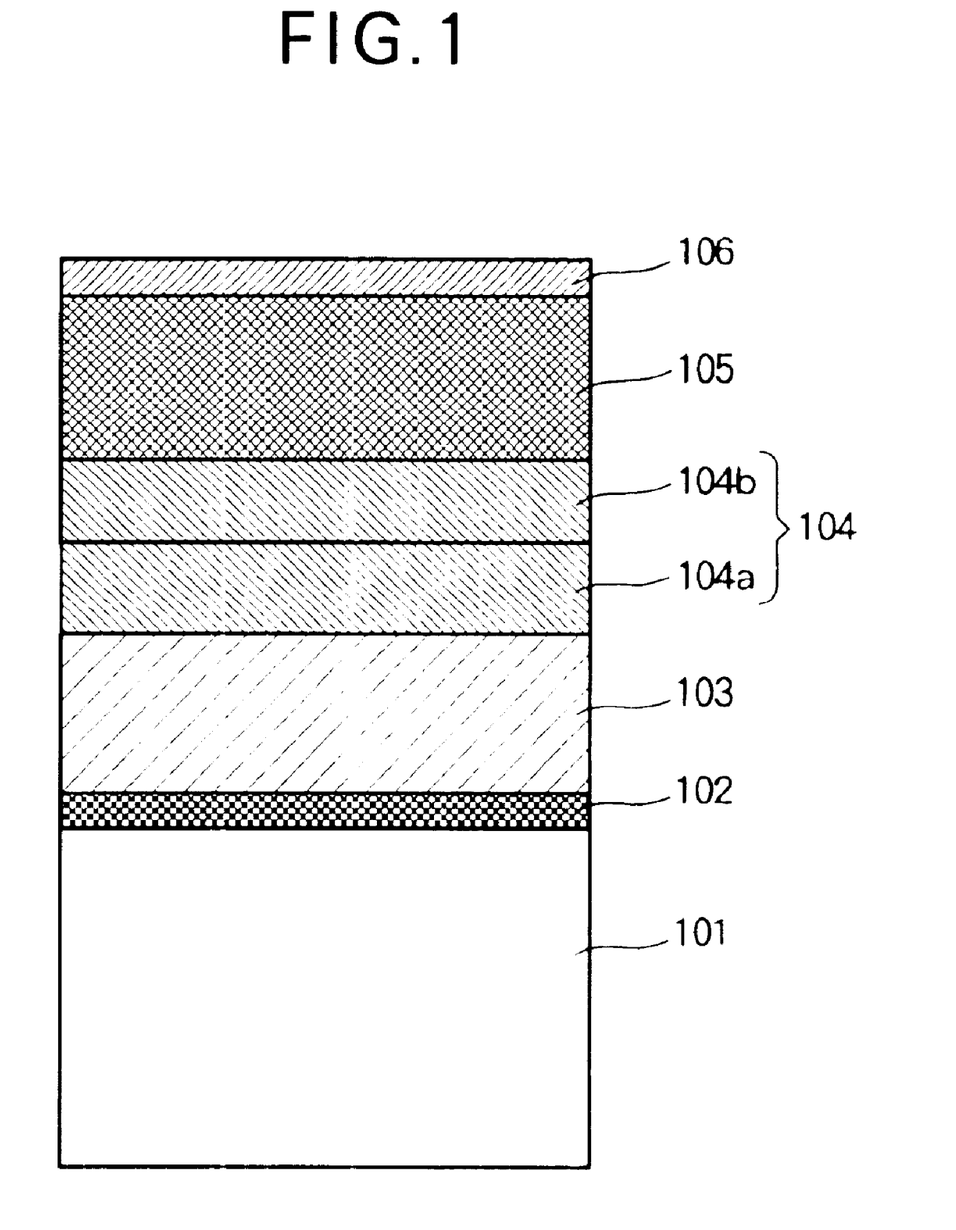
FIG. 1 is a sectional view of a multilayer semiconductor epitaxial structure illustrating a first embodiment of the invention.

Referring to FIG. 1, the first embodiment is a semiconductor epitaxial structure formed on a substrate 101. The structure comprises a buffer layer 102, a first cladding layer 103, an active layer 104 including a first active sublayer 104a and a second active sublayer 104b, a second cladding layer 105, and a contact layer 106. In the following description, the substrate and epitaxial layers have the following conductive types: the substrate 101, buffer layer 102, first cladding layer 103, and first active sublayer 104a are p-type; the second active sublayer 104b, second cladding layer 105, and contact layer 106 are n-type. A pn junction is therefore present in the active layer 104, at the interface between the first and second active sublayers.

Figure 2:
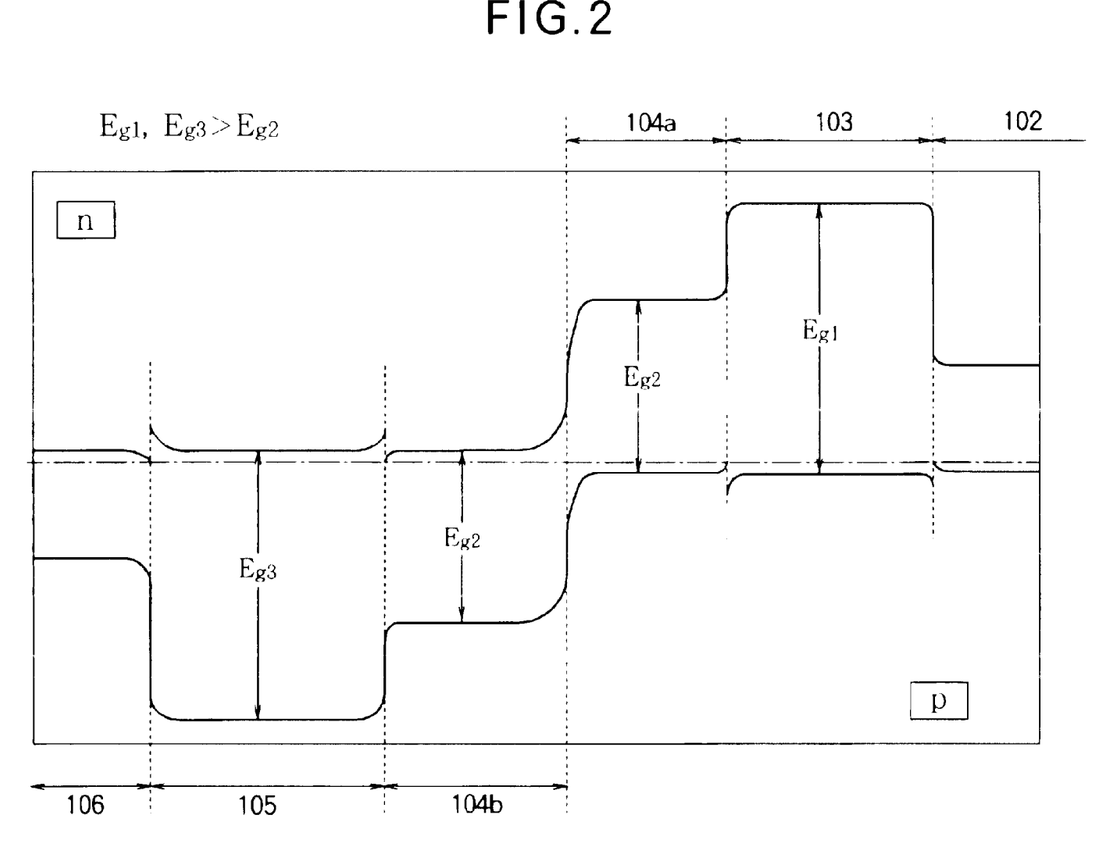
FIG. 2 schematically illustrates the energy band structure of the semiconductor epitaxial structure in FIG. 1.

The epitaxial layers have energy band gaps illustrated in FIG. 2. In the following description, $E_{g1}$ denotes the energy band gap of the first cladding layer 103, $E_{g2}$ denotes the energy band gap of the first active sublayer 104a and second active sublayer 104b, and $E_{g3}$ denotes the energy band gap of the second cladding layer 105. The energy band gaps of the cladding layers 103, 105 are both wider than the energy band gap of the active layer.

$$Eg1, Eg3 > Eg2$$

Hetero-epitaxial interfaces are formed at the interfaces between the epitaxial layers, more specifically, at the interface the buffer layer 102 and first cladding layer 103, the interface between the first cladding layer 103 and first active sublayer 104a, the interface between the second active sublayer 104b and second cladding layer 105, and the interface the second cladding layer 105 and contact layer 106. At each of these interfaces, the energy band curves bend continuously or jump discontinuously, as shown in FIG. 2. In particular, there is an energy barrier for holes in the valence band at the interface between the second cladding layer 105 and the second active sublayer 104b, and an energy barrier for electrons in the conduction band at the interface between the first active sublayer 104a and the first cladding layer 103. Another energy barrier, equivalent to the diffusion potential of the pn junction, is present at the interface between the p-type first active sublayer 104a and the n-type second active sublayer 104b. This diffusion potential arises from the differing electrostatic potentials of the p-type first active sublayer 104a and the n-type second active sublayer 104b when the pn junction is formed, which causes carriers to diffuse across the pn junction and create a depletion region on both sides thereof.

Figure 3:
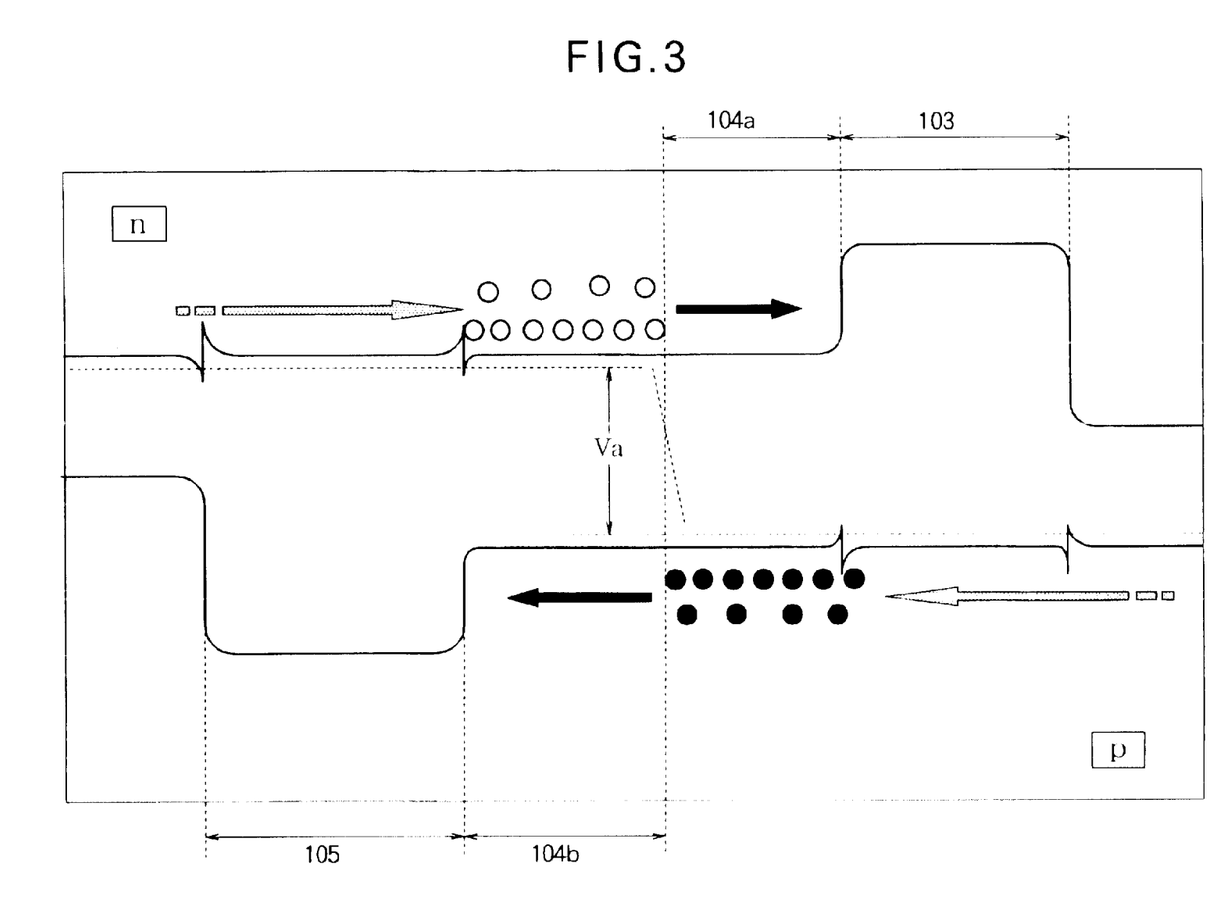
FIG. 3 schematically illustrates the energy band structure at the pn junction in FIG. 1 when a forward voltage is applied.

FIG. 3 illustrates current flow at the pn junction when a forward voltage Va approximately equal to the diffusion potential is applied, making the p-side of the semiconductor epitaxial structure relatively positive and the n-side relatively negative. As the forward voltage is increased, the energy barrier at the pn junction decreases, allowing increasing numbers of electrons to move from the n-type second active sublayer 104b to the p-type first active sublayer 104a, and increasing numbers of holes to move from the p-type first active sublayer 104a to the n-type second active sublayer 104b. That is, electrons are injected from the n-type second active sublayer 104b into the p-type first active sublayer 104a, and holes are injected from the p-type first active sublayer 104a into the n-type second active sublayer 104b. The energy barrier at the interface between the first cladding layer 103 and first active sublayer 104a prevents the electrons injected into the first active sublayer 104a from diffusing into the first cladding layer 103, so the injected electrons are confined in the first active sublayer 104a. Similarly, the energy barrier at the interface between the first cladding layer 103 and first active sublayer 104a prevents the holes injected into the second active sublayer 104b from diffusing into the second cladding layer 105, so the injected holes are confined in the second active sublayer 104b. Both types of injected carriers, the electrons injected as minority carriers into the first active sublayer 104a and the holes injected as minority carriers into the second active sublayer 104b, are thus confined to the active layer 104, enabling the density of both types of injected carriers in the active layer to be increased.

The substrate and epitaxial layers comprise, for example, the following materials: the substrate 101 is p-type GaAs, and may be a p-type GaAs semiconductor wafer; the buffer layer 102 is p-type GaAs; the first cladding layer 103 is p-type $Al_xGa_{1-x}As$ ($1 \geq x \geq 0$); the first active sublayer 104a is p-type $Al_yGa_{1-y}As$ ($1 \geq y \geq 0$); the second active sublayer 104b is n-type $Al_yGa_{1-y}As$; the second cladding layer 105 is n-type $Al_zGa_{1-z}As$ ($1 \geq z \geq 0$); the contact layer 106 is n-type GaAs.

The n-type and p-type layers are created by doping the above materials with impurities. Silicon (Si), for example, may be used as an n-type doping impurity, and zinc (Zn) as a p-type doping impurity. These impurities may be introduced during, for example, the process in which the epitaxial layers are grown. Exemplary doping impurity concentrations are $1 \times 10^{19}$ cm$^{-3}$ for the p-type GaAs and p-type $Al_xGa_{1-x}As$ layers, $5 \times 10^{18}$ cm$^{-3}$ for the p-type and n-type $Al_yGa_{1-y}As$ layers, $5 \times 10^{17}$ cm$^{-3}$ for the n-type $Al_zGa_{1-z}As$ layer, and $1 \times 10^{18}$ cm$^{-3}$ for the n-type GaAs layer. The comparatively high impurity concentration in the active layer 104 reduces the voltage drop in the active layer, even if the active layer is comparatively thick. The first cladding layer 103, first active sublayer 104a, second active sublayer 104b, and second cladding layer 105 may all have, for example, equal thicknesses of one-half micrometer (0.5 μm).

By providing a pn junction in the active layer, the first embodiment is able to confine both electrons and holes injected across the pn junction at high density in the active layer, thereby increasing the recombination probability of both types of carriers in the active layer, so that a semiconductor light-emitting device with a high emissive efficiency can be obtained, even in the region of low current injection. The majority carrier density is determined when the semiconductor layers are formed, by the impurity doping density of the semiconductor epitaxial layers, or by the electrically activated dopant density, but the density of both injected electrons and injected holes can be altered, thus controlled, by means of the voltage applied to the pn junction, thereby controlling the current flux through the pn junction and the number of injected carriers per unit volume.

Providing a pn junction within the active layer also enables the active layer to be thickened without increasing the voltage drop in the active layer, provided the impurity doping concentration in the active layer is increase correspondingly. A reduction in emissive efficiency due to overflow of injected carriers can thus be prevented even in the high current injection operating region, and a semiconductor light-emitting device combining low resistance, low power consumption, and a highly linear operating characteristic (current vs. optical power) in the high current injection region can be obtained.

Another effect of providing a pn junction in the active layer is that the areas in which both types of injected carriers (both electrons and holes) recombine are disposed within the active layer. Electron recombination and hole recombination therefore both produce emitted light of the same wavelength.

Still another effect is that if the n-type and p-type semiconductor layers constituting the active layer (the first active sublayer 104a and second active sublayer 104b) are doped when they are formed by epitaxial growth, a pn junction can be created that is extremely flat, uniform, defect-free, and parallel to the surfaces of the semiconductor epitaxial structure.

Second Embodiment

Figure 4:
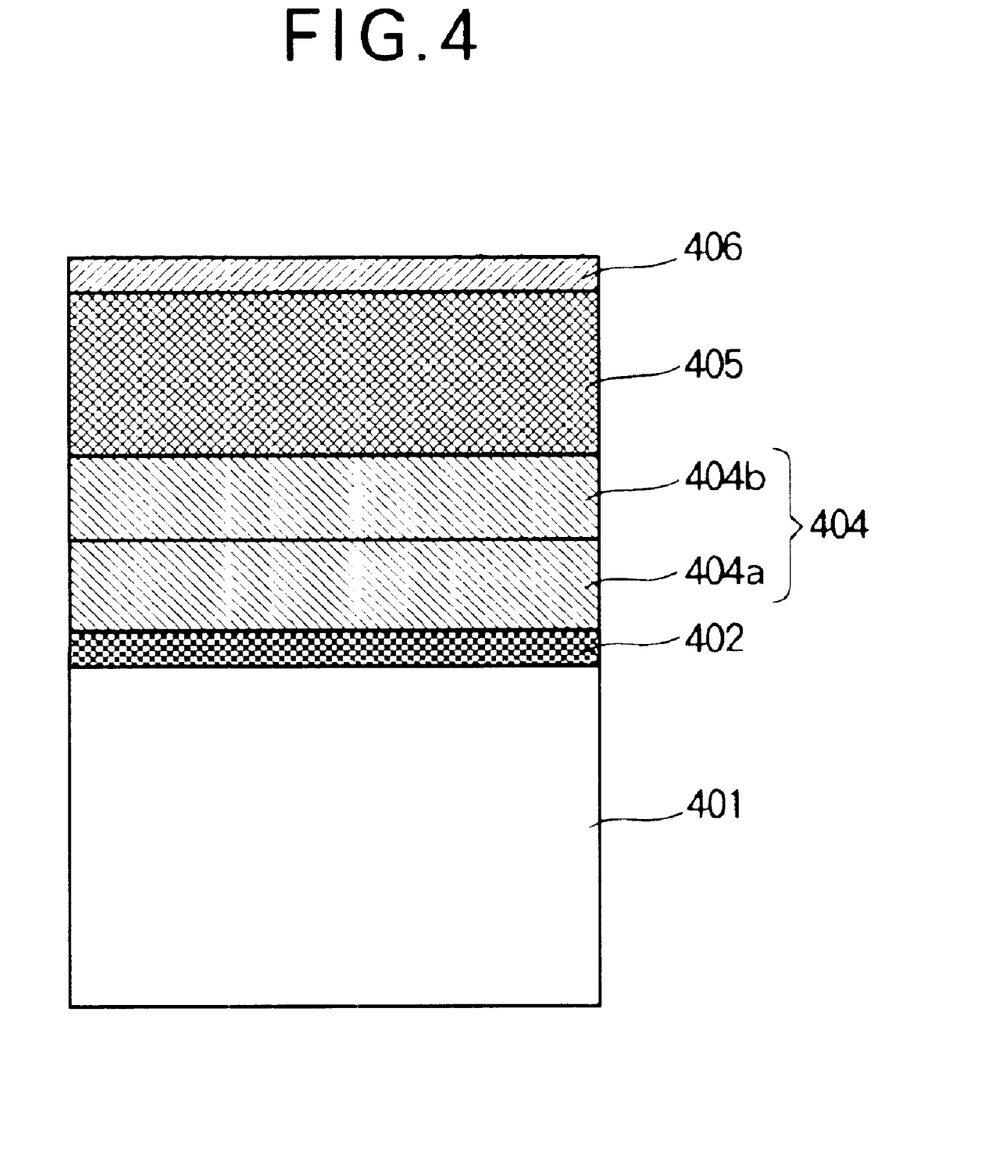
FIG. 4 is a sectional view of a multilayer semiconductor epitaxial structure illustrating a second embodiment of the invention.

Referring to FIG. 4, the second embodiment is a semiconductor epitaxial structure formed on a substrate 401. The structure comprises a buffer layer 402, an active layer 404 including a first active sublayer 404a and a second active sublayer 404b, a cladding layer 405, and a contact layer 406. In the following description, the substrate and epitaxial layers have the following conductive types: the substrate 401, buffer layer 402, and first active sublayer 404a are n-type; the second active sublayer 404b, cladding layer 405, and contact layer 406 are p-type.

The second embodiment differs from the first embodiment in that the lower cladding layer is omitted from the semiconductor epitaxial structure, and the conductivity types are reversed so that p-type layers are disposed above the pn junction in the active layer 404, and n-type layers are disposed below the pn junction. (In the first embodiment in FIG. 1, the p-type layers are below the pn junction and the n-type layers are above the pn junction.) Consequently, the holes injected into the first active sublayer 404a are not confined by an energy barrier. Nevertheless, since the active layer includes a region in which the injected holes are minority carriers, and since they recombine with electrons (majority carriers) in this region, they contribute to the emission of light. The electrons injected into the second active sublayer 404b are confined as in the first embodiment by the energy barrier at the interface between the second active sublayer 404b and cladding layer 405, which prevents them from scattering into the cladding layer 405. The carrier density in the active layer can therefore be increased.

Like the first embodiment, the second embodiment provides a semiconductor optical device with low resistance, low power consumption, high light-emitting efficiency and a highly linear operating characteristic (current vs. optical power) over a wide current range, extending into the high current injection region.

In the first and second embodiments, the pn junction was shown as located at a position substantially halfway through the thickness of the active layer, but this is not a restriction. The electrons injected into the p-type part of the active layer have a shorter mean free path than the holes. Since most of the injected carriers recombine within a distance equal to their mean free path, an effective strategy is to raise the density of injected electrons and holes within their mean free path. The pn junction may therefore be located so that the p-side is thicker than the n-side.

The cladding layers in the first and second embodiments need not have a single-layer structure. Each cladding layer may have a multilayer structure comprising an arbitrary number of individual semiconductor layers.

The material of the semiconductor epitaxial layers in the first and second embodiments was $Al_xGa_{1-x}As$ ($1 \geq x \geq 0$), but the invention is not limited to this material. Other possible materials include quaternary materials such as aluminum gallium indium phosphide $(Al_xGa_{1-x})_yIn_{1-y}P$ ($1 \geq x \geq 0$, $1 \geq y \geq 0$), and nitrides such as gallium nitride (GaN), aluminum gallium nitride (AlGaN), and indium gallium nitride (InGaN).

In the first embodiment, the substrate 101, buffer layer 102, first cladding layer 103, and first active sublayer 104a may be n-type, and the second active sublayer 104b, second cladding layer 105, and contact layer 106 may be p-type. In both the first and second embodiments, the substrate may comprise semi-insulating GaAs, and the buffer layer and cladding layers may be non-doped layers.

Third Embodiment

Figure 5:
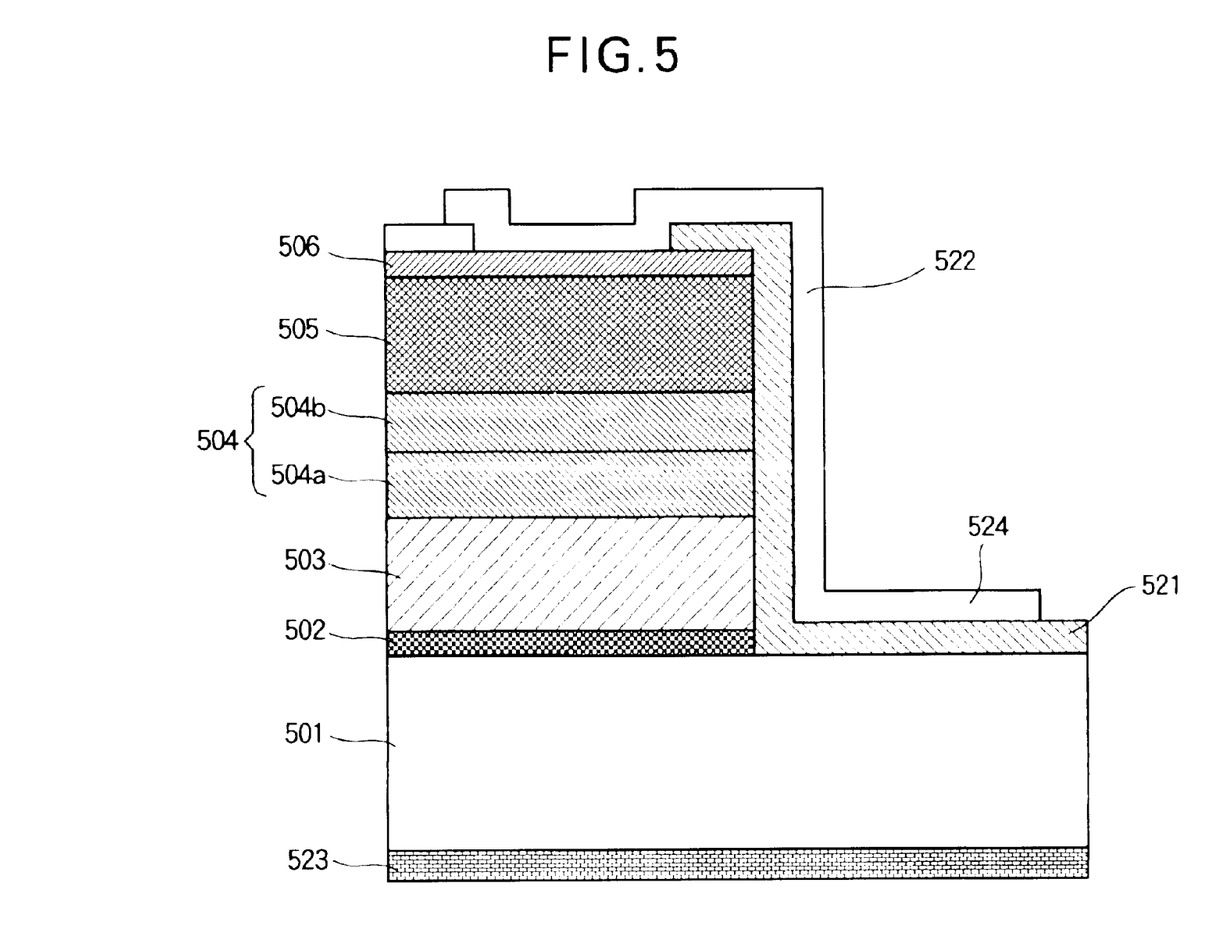
FIG. 5 is a sectional view of a semiconductor light-emitting device illustrating a third embodiment of the invention.
Figure 6:
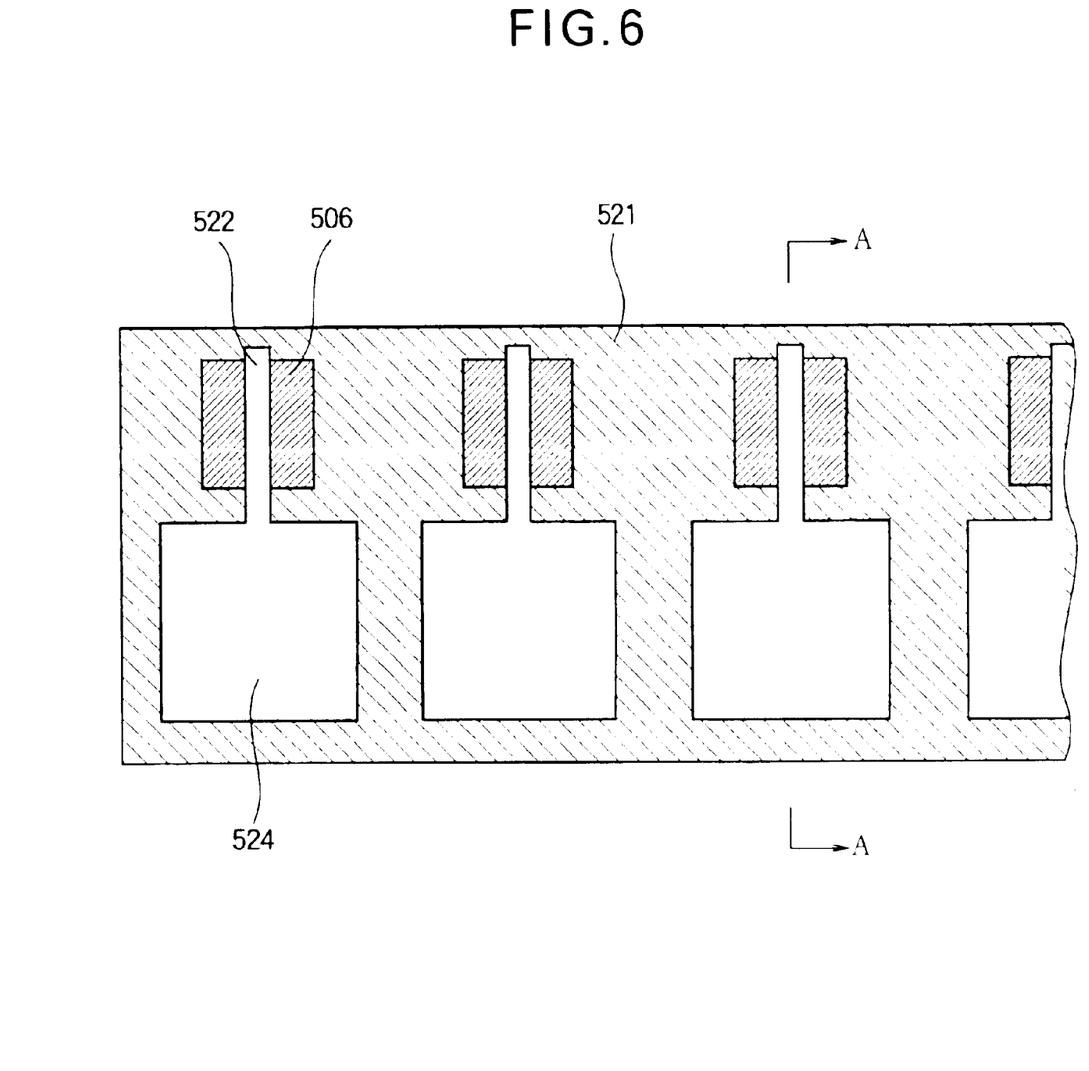
FIG. 6 is a partial plan view of the semiconductor light-emitting device in the third embodiment.

Referring to FIGS. 5 and 6, the third embodiment is a semiconductor light-emitting device comprising a substrate 501 on which are disposed a plurality of mutually separated semiconductor epitaxial structures, each comprising a buffer layer 502, a first cladding layer 503, an active layer 504 including a first active sublayer 504a and a second active sublayer 504b, a second cladding layer 505, and a contact layer 506. These layers 502–506 are similar to the corresponding layers 102–106 in the first embodiment. The semiconductor epitaxial structures are disposed in a substantially linear array. The parts of the substrate 501 not covered by the semiconductor epitaxial structures are covered by an interlayer dielectric film 521, which also covers parts of the semiconductor epitaxial structures. Each semiconductor epitaxial structure has an individual electrode 522 that makes electrical contact with the contact layer 506 at the top of the semiconductor epitaxial structure. All of the semiconductor epitaxial structures share a common electrode 523 formed on the underside of the substrate 501. The individual electrodes 522 lead to respective electrode pads 524, which are disposed on the interlayer dielectric film 521 above the substrate 501. Each semiconductor epitaxial structure emits light when supplied with forward current through its electrode pad 524 and the common electrode 523.

A preferred fabrication process for the semiconductor light-emitting device of the third embodiment starts from a semiconductor wafer that will become the substrate 501. The buffer layer 502, first cladding layer 503, active layer 504, second cladding layer 505, and contact layer 506 are grown epitaxially on the substrate 501, creating what is referred to as a semiconductor epitaxial wafer. Next, the semiconductor epitaxial wafer is selectively etched to leave a linear array of semiconductor epitaxial structures, each comprising a buffer layer 502, a first cladding layer 503, an active layer 504, a second cladding layer 505, and a contact layer 506, the substrate 501 being exposed in other areas.

Next the interlayer dielectric film 521 is deposited, covering all exposed surfaces of the substrate 501 and the semiconductor epitaxial structures, including side surface of the latter. The interlayer dielectric film 521 is then patterned to expose the contact layer 506 at the top of each semiconductor epitaxial structure. A conductive film is deposited and patterned to form the individual electrodes 522 and electrode pads 524, the individual electrodes 522 making electrical contact with the exposed contact layers 506. Another conductive film is deposited on the underside of the substrate 501 to form the common electrode 523.

When a forward voltage is applied between an individual electrode 522 and the common electrode 523, current flows across the pn junction in the corresponding semiconductor epitaxial structure, minority carriers are injected into the active layer 504 of this semiconductor epitaxial structure, the minority carriers recombine with majority carriers, and light is emitted. Light emission from each semiconductor epitaxial structure can be controlled independently by controlling the voltage applied to its individual electrode 522.

The third embodiment provides a semiconductor light-emitting device with an array of light-emitting elements having the advantages noted in the first embodiment: low resistance, low power consumption, high emissive efficiency, high optical output when driven at a low current level, and an operating characteristic (current vs. optical power) with excellent linearity even when the device is driven at a high current level.

Due to the low resistance and low power consumption of the individual light-emitting semiconductor epitaxial structures, the semiconductor light-emitting device as a whole generates comparatively little heat and its temperature does not rise.

In a variation of the third embodiment, the semiconductor epitaxial structure of the second embodiment is used instead of the semiconductor epitaxial structure of the first embodiment.

Fourth Embodiment

Figure 7:
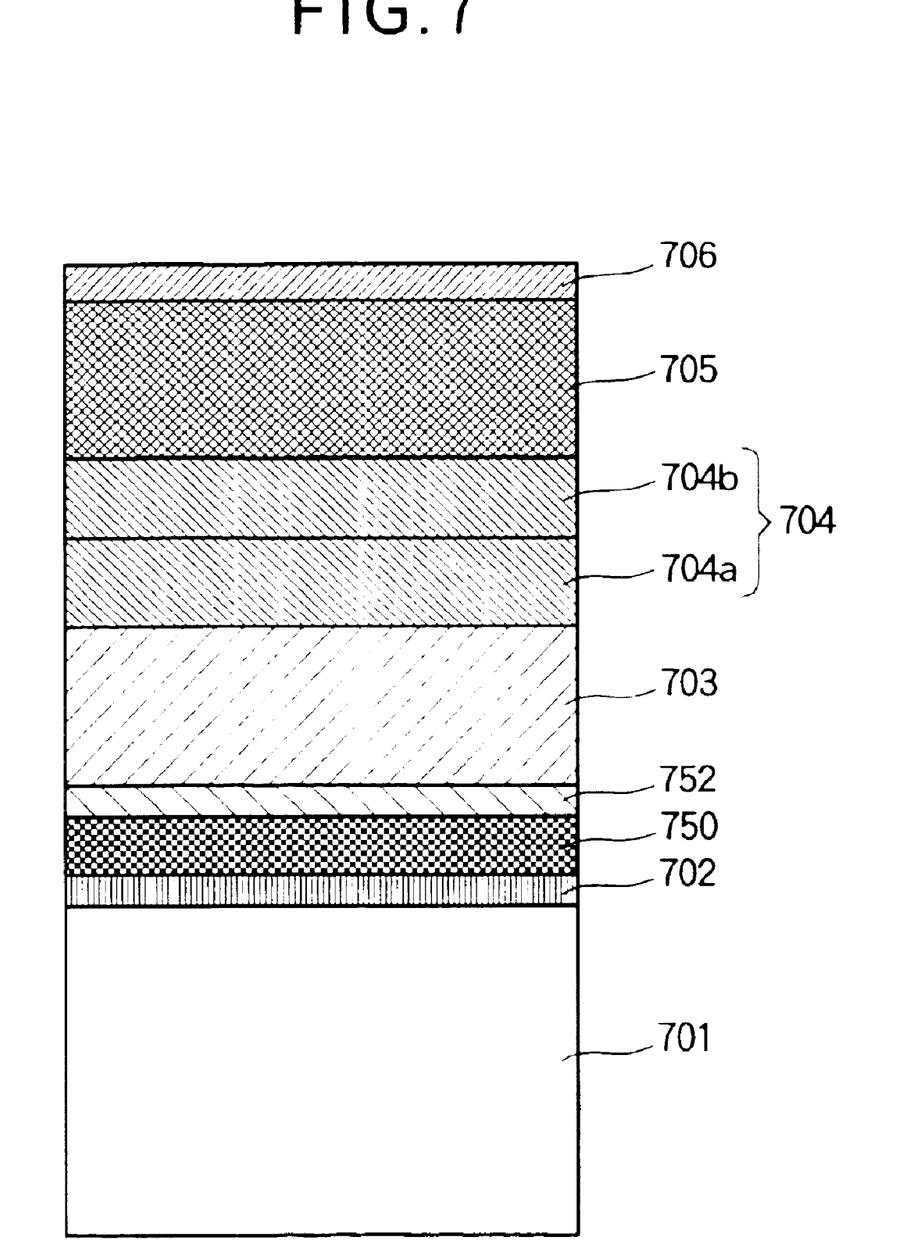
FIG. 7 is a sectional view of a multilayer semiconductor epitaxial structure illustrating a fourth embodiment of the invention.

Referring to FIG. 7, the seventh embodiment is a semiconductor structure comprising a substrate 701, a buffer layer 702, a sacrificial layer 750, a first contact layer 752, a first cladding layer 703, an active layer 704 including a first active sublayer 704a and a second active sublayer 704b, a second cladding layer 705, and a second contact layer 706. The substrate 701, buffer layer 702, first cladding layer 703, active layer 704, second cladding layer 705, and second contact layer 706 may be, for example, identical to the corresponding layers in the first embodiment (FIG. 1). The fourth embodiment then differs from the first embodiment by the insertion of the sacrificial layer 750 and first contact layer 752 between the buffer layer 702 and first cladding layer 703. The substrate 701 in this case comprises GaAs.

The sacrificial layer 750 is a semiconductor layer that enables the epitaxial structure from the first contact layer 752 to the second contact layer 706 to be separated from the substrate 701 by lift-off. The sacrificial layer 750 may be an aluminum arsenide (AlAs) layer, for example.

The first contact layer 752 is a semiconductor epitaxial layer that facilitates the attachment of the semiconductor epitaxial structure to a different substrate after it has been separated from the substrate 701 by lift-off. The first contact layer 752 may be, for example, a p-type GaAs layer, having the same conductive type as the buffer layer 702 and first cladding layer 703.

The fourth embodiment provides the same effects as the first embodiment, including low resistance, low power consumption, high light-emitting efficiency and a highly linear operating characteristic (current vs. optical power) over a wide current range, extending from low to high current levels, including the high current injection region.

In addition, by providing a sacrificial layer between the semiconductor epitaxial layers and the substrate on which they are formed, the fourth embodiment enables the semiconductor epitaxial structure to be separated from the substrate by lift-off and reattached to a different substrate, as described in the next embodiment.

In a variation of the fourth embodiment, either the first cladding layer 703 or the second cladding layer 705 may be omitted.

Fifth Embodiment

Figure 8:
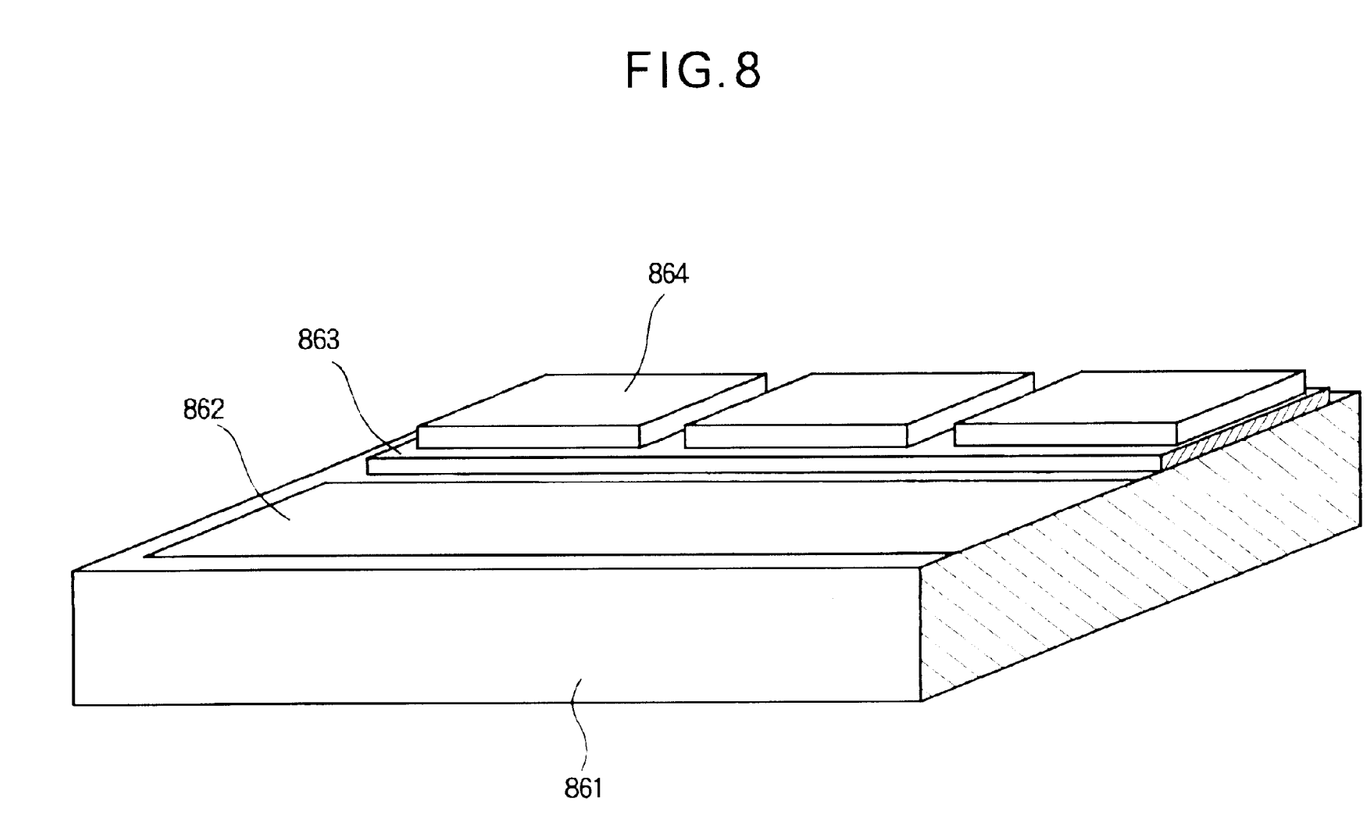
FIG. 8 is a perspective view of a semiconductor light-emitting device illustrating a fifth embodiment of the invention.

Referring to FIG. 8, the fifth embodiment is a semiconductor optical device incorporating the semiconductor epitaxial structure of the fourth embodiment, reattached to a substrate, such as a silicon (Si) substrate, of a type different from the substrate 701 on which it was formed. An integrated driver circuit 862 is formed in this substrate 861. A metal layer 863 is formed on part of the surface of the substrate 861, and a plurality of mutually separated semiconductor epitaxial structures 864 are attached to the metal layer 863.

Each semiconductor epitaxial structure 864 has the structure described in the fourth embodiment, including a first contact layer 752, a first cladding layer 703, an active layer 704, a second cladding layer 705, and a second contact layer 706 (FIG. 7), the active layer 704 comprising a p-type first active sublayer 704a and an n-type second active sublayer 704b. Each semiconductor epitaxial structure 864 functions as a separate light-emitting element. The semiconductor epitaxial structures 864 are disposed in a substantially linear array, and are driven by the integrated driver circuit 862, to which they are electrically connected by conductive interconnecting lines and electrodes (not shown).

In a preferred fabrication process for the fifth embodiment, an epitaxial wafer is created with the structure shown in the fourth embodiment, comprising a plurality of epitaxial layers (a buffer layer 702, a sacrificial layer 750, a first contact layer 752, a first cladding layer 703, a first active sublayer 704a, a second active sublayer 704b, a second cladding layer 705, and a second contact layer 706) grown a semiconductor substrate 701.

Next, a mesa etching process is carried out to create a plurality of isolated mesas separated by regions in which the sacrificial layer 750 is exposed. Each mesa includes the layers (first contact layer 752, first cladding layer 703, first active sublayer 704a, second active sublayer 704b, second cladding layer 705, second contact layer 706) constituting one semiconductor epitaxial structure 864.

Next, a carrier sheet (not shown) is attached to the surface of the semiconductor epitaxial wafer, and the sacrificial layer 750 is etched, leaving the mesas or semiconductor epitaxial structures 864 attached to the carrier sheet. The carrier sheet and attached semiconductor epitaxial structures 864 are then lifted off from the substrate 701. For an AlAs sacrificial layer 750, a suitable etchant is hydrofluoric acid (HF), which etches AlAs much faster than the GaAs and AlGaAs materials constituting the semiconductor epitaxial structures 864. The AlAs sacrificial layer 750 can be completely removed by HF etching in a time short enough that the semiconductor epitaxial structures 864 are hardly etched at all, enabling the semiconductor epitaxial structures 864 to be lifted off virtually intact.

After lift-off, the semiconductor epitaxial structures 864 are removed from the carrier sheet and attached in a linear array to the metal layer 863 on the silicon substrate 861.

The fifth embodiment provides a semiconductor light-emitting device with the advantages noted in the preceding embodiments, including low resistance, low power consumption, high light-emitting efficiency, high optical output power at low driving current levels, and excellent linearity at high driving current levels. Moreover, by using the semiconductor epitaxial structure of the fourth embodiment, the fifth embodiment enables an array of light-emitting elements and the circuit that drives the array to be combined into a monolithic device on a single silicon substrate.

A further advantage of this combined semiconductor light-emitting device is that light emitted downward from the active layers in the semiconductor epitaxial structures 864 is reflected back upwards by the metal layer 863 and can be used together with the light emitted upward from the active layers, further increasing the light-emitting efficiency of the device.

A few variations of the preceding embodiments have been mentioned above, but those skilled in the art will recognize that further variations are possible within the scope of the invention, which is defined in the appended claims.

What is claimed is:

1. A semiconductor epitaxial structure including a first semiconductor epitaxial layer and a second semiconductor epitaxial layer, wherein:
   the first semiconductor epitaxial layer has a narrower energy band gap than the second semiconductor epitaxial layer; and
   the first semiconductor epitaxial layer includes a first semiconductor epitaxial sublayer of a first conductive type, a second semiconductor epitaxial sublayer of a second conductive type, and a pn junction interface between the first semiconductor epitaxial sublayer and the second semiconductor epitaxial sublayer.

2. The semiconductor epitaxial structure of claim 1, wherein:
   the second semiconductor epitaxial layer is of the first conductive type; and
   the first semiconductor epitaxial sublayer has an interface with the second semiconductor epitaxial layer.

3. The semiconductor epitaxial structure of claim 1, further comprising a third semiconductor epitaxial layer, the third semiconductor epitaxial layer having a wider energy band gap than the first semiconductor epitaxial layer, the first semiconductor epitaxial layer being sandwiched between the second and third semiconductor epitaxial layers.

4. The semiconductor epitaxial structure of claim 3, wherein:
   the second semiconductor epitaxial layer is of the first conductive type;
   the third semiconductor epitaxial layer is of the second conductive type;
   the first semiconductor epitaxial sublayer has an interface with the second semiconductor epitaxial layer; and
   the second semiconductor epitaxial sublayer has an interface with the third semiconductor epitaxial layer.

5. The semiconductor epitaxial structure of claim 1, wherein the first and second semiconductor epitaxial sublayers are doped with respective impurities, the impurities being introduced when the first and second semiconductor epitaxial layers are formed by epitaxial growth.

6. A semiconductor structure including the semiconductor epitaxial structure of claim 1, further comprising:
   a substrate; and
   a sacrificial layer disposed between the substrate and said semiconductor epitaxial structure, enabling the semiconductor epitaxial structure to be separated from the substrate by lift-off.

7. A semiconductor light-emitting device including the semiconductor epitaxial structure of claim 1 as a light-emitting area, further comprising an electrode for supplying current to said semiconductor epitaxial structure, thereby causing the current to flow across the junction interface in the first semiconductor epitaxial layer of the semiconductor epitaxial structure.

8. A semiconductor light-emitting device comprising the semiconductor epitaxial structure of claim 1 as a light-emitting area, further comprising a first substrate, wherein the semiconductor epitaxial structure is formed on a second substrate having a sacrificial layer, the semiconductor epitaxial structure being separated from the second substrate by lift-off and attached to the first substrate, the first substrate and the second substrate being made of different materials.

9. A semiconductor light-emitting device comprising:
   a first substrate; and
   an array of semiconductor epitaxial structures disposed on the first substrate, each semiconductor epitaxial structure including a first semiconductor epitaxial layer and a second semiconductor epitaxial layer, the first semiconductor epitaxial layer having a narrower energy band gap than the second semiconductor epitaxial layer, the first semiconductor epitaxial layer including a first semiconductor epitaxial sublayer of a first conductive type, a second semiconductor epitaxial sublayer of a second conductive type, and a pn junction interface between the first semiconductor epitaxial sublayer and the second semiconductor epitaxial sublayer;
   light being emitted from the first semiconductor epitaxial layers in the semiconductor epitaxial structures.

10. The semiconductor light-emitting device of claim 9, wherein in each said semiconductor epitaxial structure:
    the second semiconductor epitaxial layer is of the first conductive type; and
    the first semiconductor epitaxial sublayer has an interface with the second semiconductor epitaxial layer.

11. The semiconductor light-emitting device of claim 9, wherein each said semiconductor epitaxial structure further comprises a third semiconductor epitaxial layer having a wider energy band gap than the first semiconductor epitaxial layer, the first semiconductor epitaxial layer being sandwiched between the second and third semiconductor epitaxial layers.

12. The semiconductor light-emitting device of claim 11, wherein in each said semiconductor epitaxial structure:
    the second semiconductor epitaxial layer is of the first conductive type;
    the third semiconductor epitaxial layer is of the second conductive type;
    the first semiconductor epitaxial sublayer has an interface with the second semiconductor epitaxial layer; and
    the second semiconductor epitaxial sublayer has an interface with the third semiconductor epitaxial layer.

13. The semiconductor light-emitting device of claim 9, wherein the first and second semiconductor epitaxial sublayers are doped with respective impurities introduced when said first and second semiconductor epitaxial sublayers are formed by epitaxial growth.

14. The semiconductor light-emitting device of claim 9, wherein said semiconductor epitaxial structures are formed on a second substrate having a sacrificial layer, the semiconductor epitaxial structures being separated from the second substrate by lift-off and attached to the first substrate, the first substrate and the second substrate being made of different materials.

15. The semiconductor light-emitting device of claim 9, wherein the array of semiconductor epitaxial structures is substantially linear.

* * * * *